United States Patent
Matsuki et al.

(10) Patent No.: US 7,855,412 B2
(45) Date of Patent: Dec. 21, 2010

(54) SILICON CARBIDE SEMICONDUCTOR DEVICE AND METHOD OF MANUFACTURING THE SAME

(75) Inventors: Hideo Matsuki, Obu (JP); Eiichi Okuno, Mizuho (JP); Naohiro Suzuki, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/453,520

(22) Filed: May 14, 2009

(65) Prior Publication Data
US 2009/0289264 A1 Nov. 26, 2009

(30) Foreign Application Priority Data
May 20, 2008 (JP) .............................. 2008-131764

(51) Int. Cl.
*H01L 27/108* (2006.01)
*H01L 29/76* (2006.01)

(52) U.S. Cl. .................. 257/330; 257/77; 257/329; 438/270

(58) Field of Classification Search ................. 257/77, 257/329–330, 341–342, E29.084, E21.066; 438/270
See application file for complete search history.

(56) References Cited

U.S. PATENT DOCUMENTS

| | | | | |
|---|---|---|---|---|
| 6,645,815 B2 * | 11/2003 | Hshieh et al. | ............... | 438/270 |
| 2009/0072241 A1 * | 3/2009 | Harris et al. | .................. | 257/77 |
| 2009/0200559 A1 * | 8/2009 | Suzuki et al. | ................. | 257/77 |

FOREIGN PATENT DOCUMENTS

JP    A-2007-281265    10/2007

* cited by examiner

*Primary Examiner*—Theresa T Doan
(74) *Attorney, Agent, or Firm*—Posz Law Group, PLC

(57) ABSTRACT

An SiC semiconductor device includes a substrate, a drift layer disposed on a first surface of the substrate, a base region disposed above the drift layer, a source region disposed above the base region, a trench penetrating the source region and the base region to the drift layer, a gate insulating layer disposed on a surface of the trench, a gate electrode disposed on a surface of the gate insulating layer, a first electrode electrically coupled with the source region and the base region, a second electrode disposed on the second surface of the substrate, and a second conductivity-type layer disposed at a portion of the base region located under the source region. The second conductivity-type layer has the second conductivity type and has an impurity concentration higher than the base region.

5 Claims, 7 Drawing Sheets

RELATER ART

SILICON CARBIDE SEMICONDUCTOR DEVICE AND METHOD OF MANUFACTURING THE SAME

CROSS REFERENCE TO RELATED APPLICATIONS

The present application is based on and claims priority to Japanese Patent Application No. 2008-131764 filed on May 20, 2008, the contents of which are incorporated in their entirety herein by reference.

BACKGROUND OF THE INVENTION

1. Field of the Invention

The present invention relates to a silicon carbide semiconductor device and a method of manufacturing a semiconductor device.

2. Description of the Related Art

A silicon carbide (SiC) semiconductor device typically has a high breakdown field strength and can therefore control a high current. Thus, the SiC semiconductor device can be used for controlling a motor of a hybrid vehicle, for example.

In order to increase electric current that flows in a semiconductor device, a channel density can be increased. In a silicon semiconductor device, a metal-oxide semiconductor field-effect transistor (MOSFET) having a trench gate structure is in practical use. When a trench gate structure is applied to the SiC semiconductor device, difficulty arises.

A thickness, that is, a depth of a base region is sum of a thickness of a source region and a length of a channel. Thus, if the thickness of the base region is reduced, a channel resistance can be reduced. A drain-source breakdown voltage depends on the thickness and an impurity concentration of the base region. A portion of the source region located at an edge of a trench may be slightly lost during a process for adjusting a shape of the trench. Thus, the source region is required to have a sufficient thickness in case of the loss, and the thickness of the base region is set taking into consideration such circumstance.

Therefore, conventionally, the thickness and the impurity concentration of the base region are set so that the source region has a sufficient thickness, the channel resistance is low, and a high drain-source breakdown voltage is secured as described, for example, in JP-2007-281265-A.

If the impurity concentration of the base region is reduced for securing a high drain-source breakdown voltage, the breakdown voltage may be reduced and punching through may occur depending on a depth of the source region. The above-described issue is caused when the source region is formed by ion implantation. When the source region is formed by ion implantation, a part of impurities may penetrate to a portion deeper than a predetermined depth. Thus, the impurity may distribute to the portion deeper than the predetermined depth. For example, when the predetermined depth (Dp) is 0.7 µm and a source region is planned to be formed to a depth of 0.7 µm, a part of impurities reach to a portion deeper than 0.7 µm although the impurity concentration gradually decreases from a predetermined concentration (Cp) at the portion deeper than 0.7 µm.

SUMMARY OF THE INVENTION

In view of the foregoing problems, it is an object of the present invention to provide an SiC semiconductor device that can secure a high drain-source breakdown voltage regardless of a depth of a source region. Another object of the present invention is to provide a method of manufacturing an SiC semiconductor device.

An SiC semiconductor device according to an aspect of the present invention includes a substrate, a drift layer, a base region, a source region, a trench, a gate insulating layer, a gate electrode, a first electrode, a second electrode, and a second-conductivity type layer. The substrate is made of silicon carbide and has one of a first conductivity type and a second conductivity type. The substrate has first and second opposing surfaces. The drift layer is disposed on the first surface of the substrate. The drift layer is made of silicon carbide and has the first conductivity type. The base region is disposed above the drift layer and has the second conductivity type. The source region is disposed above the base region and has the first conductivity type. The trench penetrates the source region and the base region to the drift layer. The gate insulating layer is disposed on a surface of the trench. The gate electrode is disposed on a surface of the gate insulating layer in the trench. The first electrode is electrically coupled with the source region and the base region. The second electrode is disposed on the second surface of the substrate. The second conductivity-type layer is disposed at a portion of the base region located under the source region. The second conductivity-type layer has the second conductivity type and has an impurity concentration higher than the base region. An inversion channel is provided at a surface portion of the base region located on a side surface of the trench and electric current flows between the first electrode and the second electrode through the source region and the drift layer by controlling a voltage applied to the gate electrode.

In the present SiC semiconductor device, the second conductivity-type layer is located under the source region. Thus, even if first conductivity-type impurities are implanted for forming the source region and a part of impurities penetrate to a portion deeper than a predetermined depth of the source region, the second conductivity-type layer can compensate the first conductivity-type impurities. Thus, a punching through at the second conductivity-type layer and the base region located under the source region can be prevented, and a high drain-source breakdown voltage can be secured regardless of the depth of the source region.

In a method of manufacturing an SiC semiconductor device according to another aspect of the invention, a substrate made of silicon carbide and having one of a first conductivity type and a second conductivity type is prepared. The substrate has first and second opposing surfaces. A drift layer made of silicon carbide and having the first conductivity type is formed on the first surface of the substrate. A base region having the second conductivity type is formed above the drift layer. A second conductivity-type layer is formed in the base region. The second conductivity-type layer has an impurity concentration higher than the base region. A source region having the first conductivity type is formed above the base region so that the second conductivity-type layer is located under the source region. A trench is provided so as to penetrate the source region and the base region to the drift layer. A gate insulating layer is formed on a surface of the trench. A gate electrode is formed on a surface of the gate insulating layer in the trench. A first electrode is formed so as to be electrically coupled with the source region and the base region. A second electrode is formed on the second surface of the substrate.

In the present manufacturing method, the second conductivity-type layer is formed under the source region. Thus, even if first conductivity-type impurities are implanted for forming the source region and a part of the first conductivity-type penetrates to a portion deeper than a predetermined depth of the source region, the second conductivity-type layer can compensate the first conductivity-type impurities. Thus, a punching through at the second conductivity-type layer and the base region located under the source region can be prevented, and a high drain-source breakdown voltage can be secured regardless of the depth of the source region.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

First Embodiment

Figure 1:
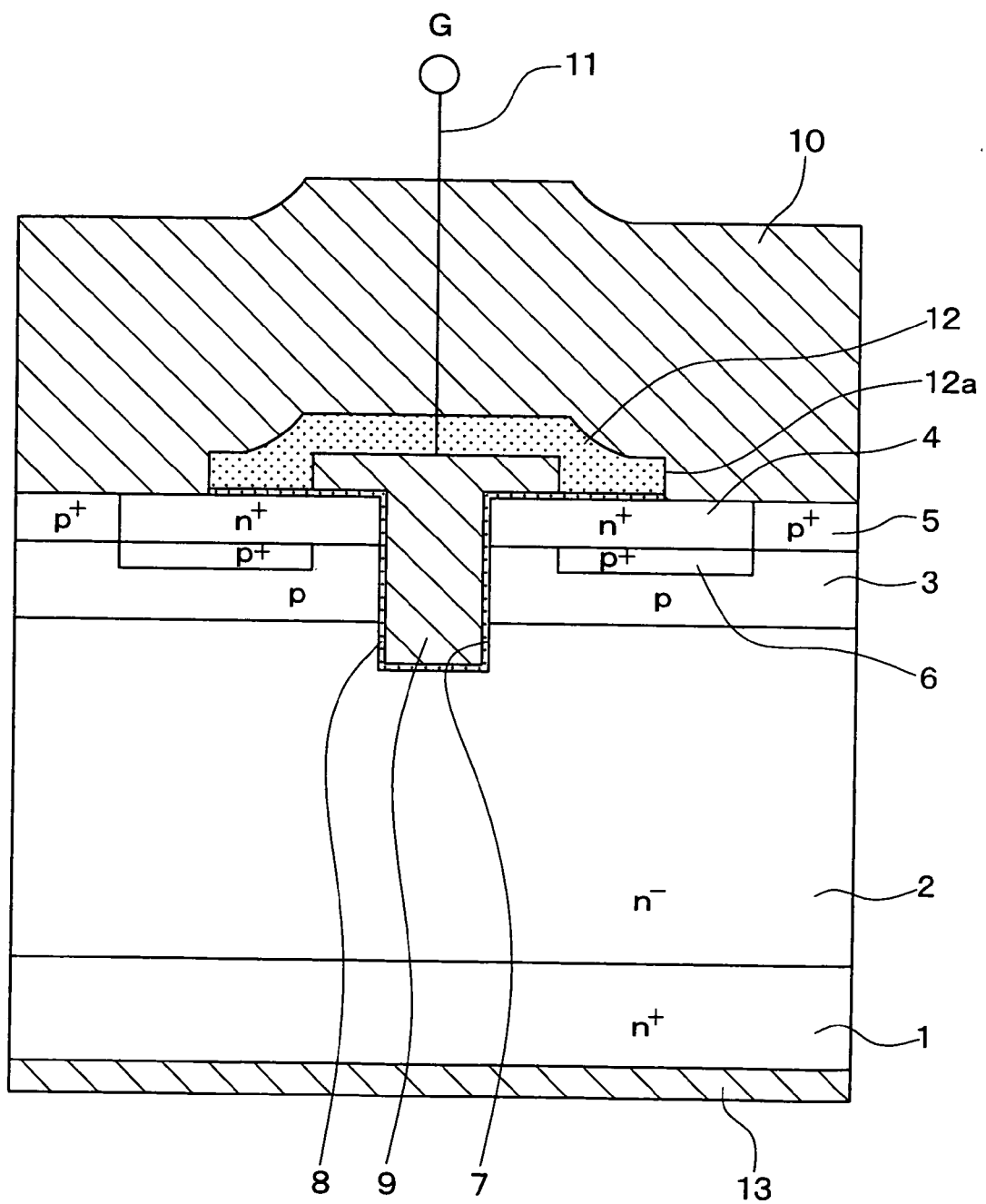
FIG. 1 a diagram illustrating a cross-sectional view of a MOSFET in an SiC semiconductor device according to a first embodiment of the present invention.

An SiC according to a first embodiment of the present invention includes a plurality of MOSFETs each having an inversion-type trench gate structure. The MOSFETs are arranged next to each other in a plurality of lines. An exemplary configuration of one of the MOSFETs will be described with reference to FIG. 1.

The MOSFET includes an N+ type substrate 1. The N+ type substrate 1 has a front surface of (000-1)C-face. The N+ type substrate 1 has an N type impurity concentration of, for example, about $1.0 \times 10^{19}$ cm$^{-3}$. The N type impurity includes, for example, nitrogen. The N+ type substrate 1 has a thickness of about 300 μm. On the front surface of the N+ type substrate 1, an N− type drift layer 2 is disposed. The N− type drift layer 2 has a nitrogen concentration of about $8.0 \times 10^{15}$ cm$^{-3}$. The N− type drift layer 2 has a thickness of about 15 μm. At a surface portion of the N− type drift layer 2, a P+ type base region 3 is disposed. At a surface portion of the P type base region 3, an N+ type source region 4 and a P+ type contact region 5 are disposed. At a portion of the P type base region 3 located under the N+ type source region 4, a P+ type layer 6 is disposed.

The P type base region 3 includes, for example, boron or aluminum, as P type impurities. The P type base region 3 has a P type impurity concentration between about $1.0 \times 10^{16}$ cm$^{-3}$ and about $1.0 \times 10^{18}$ cm$^{-3}$ (for example, about $1.0 \times 10^{17}$ cm$^{-3}$). The P type base region 3 has a thickness between about 0.5 μm and about 3.0 μm (for example, about 2.0 μm). At a surface portion of the N+ type source region 4, a nitrogen concentration (surface concentration) is between about $1.0 \times 10^{20}$ cm$^{-3}$ and about $1.0 \times 10^{21}$ cm$^{-3}$ (for example, about $1.0 \times 10^{21}$ cm$^{-3}$).

The N+ type source region 4 has a thickness between about 0.2 μm and about 1.0 μm (for example, about 0.3 μm). The P+ type layer 6 includes, for example, boron or aluminum, as P type impurities. The P+ type layer 6 has a P type impurity concentration between about $1.0 \times 10^{18}$ cm$^{-3}$ and about $1.0 \times 10^{21}$ cm$^{-3}$ (for example, about $1.0 \times 10^{19}$ cm$^{-3}$). The P+ type layer 6 has a thickness between about 0.1 μm and about 1.0 μm (for example, about 0.3 μm). The P+ type layer 6 is disposed at a predetermined distance from a side surface of a trench 7. The predetermined distance is set so that the P+ type layer 6 does not affect a channel region provided at a portion of the P type base region 3 located on the side surface of the trench 7. The predetermined distance depends on the P type impurity concentration of the P type base region 3. The predetermined distance is, for example, about 0.3 μm or over.

The P+ type layer 6 includes a pair of sections. Between the pair of sections, the trench 7 is provided so as to penetrate the P type base region 3 and the N+ type source region 4 to the N− type drift layer 2. The trench 7 has a width of about 2.0 μm and a depth of about 2.0 μm, for example. The P type base region 3 and the N+ type source region 4 are in contact with the side surface of the trench 7. The side surface of the trench 7 is covered with a gate oxide layer 8. On a surface of the gate oxide layer 8, a gate electrode 9 is disposed so as to fill the trench 7. The gate electrode 9 is made of doped polysilicon.

The trench 7 has a bottom surface of (000-1)-face and has a side surface extending in [11-20] direction. For example, the side surface is (1120)-face. The gate oxide layer 8 can be formed by thermally oxidizing the surface of the trench 7. Alternatively, the gate oxide layer 8 can be formed by chemical vapor deposition. When the gate oxide layer 8 is formed by thermal oxidation, oxidizing rate at the bottom portion of the trench 7 is five times faster than the side surface of the trench 7. Thus, the gate oxide layer 8 has a thickness of about 40 nm on the side surface of the trench 7 and has a thickness of about 200 nm at the bottom portion of the trench 7.

The P+ type contact region 5 is disposed at a center portion of the P type base region 3 located between adjacent trenches 7. That is, the P+ type contact region 5 is disposed on an opposite side of the N+ type source region 4 from the trench 7.

On a surface of the N+ type source region 4, a surface of the P+ type contact region 5, and a surface of the gate electrode 9, a source electrode 10 and a gate wiring 11 are disposed. The source electrode 10 and the gate wiring 11 are made of a plurality of metals, for example, an alloy of nickel and aluminum. At least portions of the source electrode 10 and the gate wiring 11 being in contact with an N type SiC are made of a metal that can provide an ohmic connection between each of the source electrode 10 and the gate wiring 11 and the N type SiC. The N type SiC includes the N+ type source region 4 and the gate electrode 9 if the gate electrode 9 includes N type impurities. At least portions of the source electrode 10 and the gate wiring 11 being in contact with a P type SiC are made of a metal that can provide an ohmic connection between each of the source electrode 10 and the gate wiring 11 and the P type SiC. The P type SiC includes the P+ type contact region 5 and the gate electrode 9 if the gate electrode 9 includes P type impurities. The source electrode 10 and the gate wiring 11 are located on an interlayer insulating layer 12. Thus, the source electrode 10 and the gate wiring 11 are electrically insulated. The source electrode 10 is electrically coupled with the N+ type source region 4 and the P+ type contact region 5 through contact holes 12a provided in the interlayer insulating layer 12. The gate wiring 11 is electrically coupled with the gate electrode 9 though a contact hole (not shown) provided in the interlayer insulating layer 12.

On a rear surface of the N+ type substrate 1, a drain electrode 13 is formed. The drain electrode 13 is electrically coupled with the N+ type substrate 1. Thereby, the MOSFET having the N channel inversion type trench gate structure is formed.

When the gate voltage is applied to the gate electrode 9, a portion of the P type base region 3 located on the side surface of the trench 7 becomes an inversion channel and electric current flows between the source electrode 10 and the drain electrode 13. The P+ type layer 6 is located at the predetermined distance (for example, about 0.3 µm) from the gate oxide layer 8 so that the P+ type layer 6 does not affect the channel region. Thus, the P+ type layer 6 does not reduce channel mobility.

The P+ type layer 6 is located under the N+ type source region 4. Thus, even if the N+ type impurities are implanted for forming the N+ type source region 4 and a part of the N+ type impurities penetrates to a portion deeper than a predetermined depth of the N+ type source region 4, the P+ type layer 6 can compensate the N+ type impurities. Thus, a punching through at the P+ type layer 6 and the P type base region 3 located under the N+ type source region 4 can be prevented, and the MOSFET can have a high drain-source breakdown voltage regardless of the depth of the N+ type source region 4.

An exemplary method of manufacturing the MOSFET illustrated in FIG. 1 will now be described with reference to FIG. 2A to FIG. 3C.

Figure 2A:
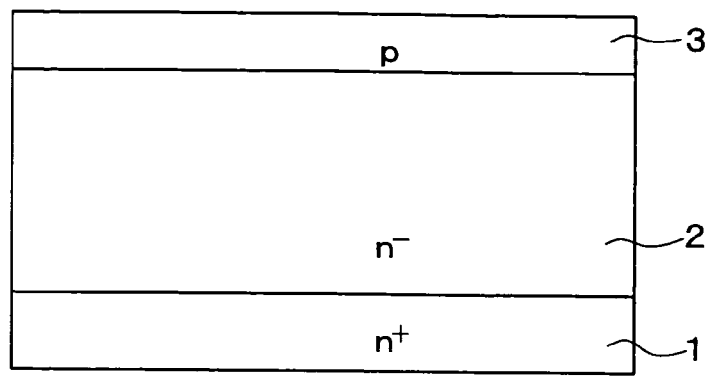
FIG. 2A to FIG. 3C are diagrams illustrating a manufacturing process of the MOSFET illustrated in FIG. 1.

During a process illustrated in FIG. 2A, the N+ type substrate 1 is prepared. The N+ type substrate 1 has a nitrogen concentration of, for example, about $1.0 \times 10^{19}$ cm$^{-3}$. The N+ type substrate 1 has a thickness of, for example, about 300 µm. On the front surface of the N+ type substrate 1, an N– type drift layer 2 is epitaxially formed. The N– type drift layer 2 has the nitrogen concentration of, for example, about $8.0 \times 10^{15}$ cm$^{-3}$. The N– type drift layer 2 has a thickness of, for example, about 15 µm. Then, a mask (not shown) is formed on the front surface of the N– type drift layer 2. The mask is made of, for example, low temperature oxide (LTO). Then, the mask is treated by a photolithography process so that opening portions are provided at regions where the P type base region 3 will be formed. The P type impurities such as boron or aluminum are ion-implanted through the mask and are activated. Thereby, the P type base region 3 having the P type impurity concentration of about $1.0 \times 10^{17}$ cm$^{-3}$ and having the thickness of about 2.0 µm is formed. After forming the P type base region 3, the mask is removed.

In the above-described example, the P type base region 3 is formed by ion implantation. Alternatively, the P type base region 3 may be formed by epitaxial growing while doping the P type impurities.

Figure 2B:
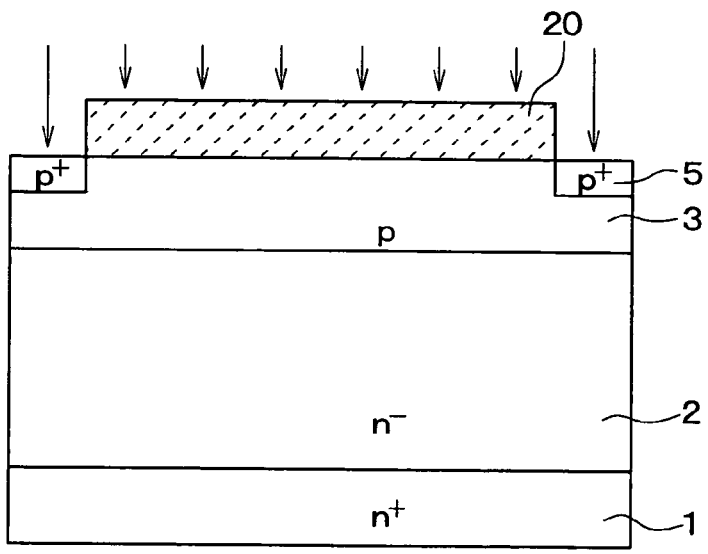

During a process illustrated in FIG. 2B, a mask 20, for example, made of LTO is formed on the P type base region 3 and an exposed portion (not shown) of the N– type drift layer 2. Then, the mask 20 is treated by a photolithography process so that opening portions are provided at regions where the P+ type contact region 5 will be formed. The P type impurities such as boron or aluminum are ion-implanted through the mask 20 and are activated. Thereby, the P+ type contact region 3 having the P type impurity concentration between about $1.0 \times 10^{19}$ cm$^{-3}$ and about $1.0 \times 10^{21}$ cm$^{-3}$ (for example, about $1.0 \times 10^{20}$ cm$^{-3}$) and having the thickness between about 0.2 µm and about 1.0 µm (for example, about 0.7 µm) is formed. After forming the P+ type contact region 5, the mask 20 is removed.

Figure 2C:
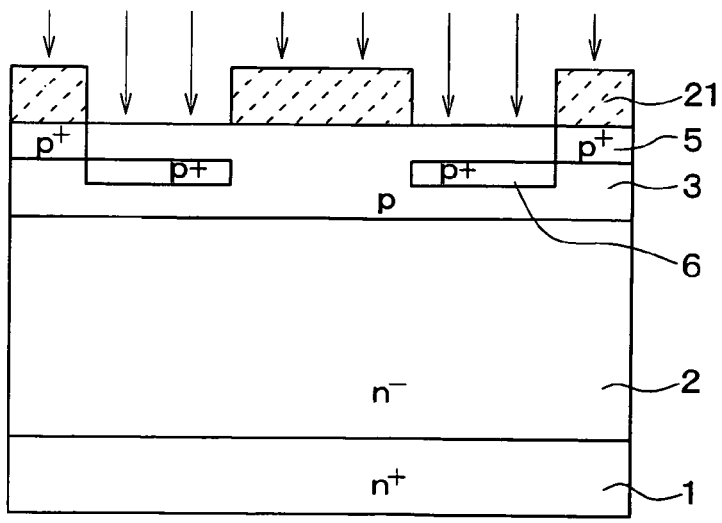

During a process illustrated in FIG. 2C, a mask 21, for example, made of LTO is formed on the P type base region 3, the P+ type contact region 5, and the exposed portion of the N– type drift layer 2. Then, the mask 21 is treated by a photolithography process so that opening portions are provided at regions where the P+ type layer 6 will be formed. The P type impurities such as boron or aluminum are ion-implanted through the mask 21 and are activated. Thereby, the P+ type layer 6 having the P type impurity concentration between about $1.0 \times 10^{18}$ cm$^{-3}$ and about $1.0 \times 10^{21}$ cm$^{-3}$ (for example, about $1.0 \times 10^{19}$ cm$^{-3}$) and having the thickness between about 0.1 µm and about 1.0 µm (for example, about 0.3 µm) is formed.

Figure 3A:
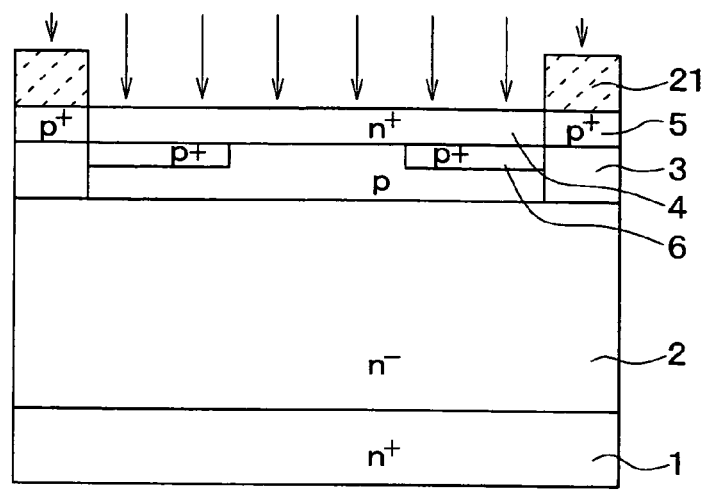

During a process illustrated in FIG. 3A, the mask 21 is further treated by a photolithography process so that opening portions are provided at regions where the N+ type source region 4 will be formed. The P type impurities such as nitrogen are ion-implanted through the mask 21 and are activated. Thereby, the N+ type source region 4 having a thickness between about 0.2 µm and about 1.0 µm (for example, about 0.3 µm) is formed. The nitrogen concentration at the surface portion of the N+ type source region 4 is between about $1.0 \times 10^{20}$ cm$^{-3}$ and about $1.0 \times 10^{21}$ cm$^{-3}$. After forming the N+ type source region 4, the mask 21 is removed. The N+ type source region 4 and the P+ type layer 6 are formed by using the same mask, that is, the mask 21. Thus, the N+ type source region 4 and the P+ type layer 6 can be formed with a self-alignment technique. In addition, the number of mask-forming process can be reduced, and thereby manufacturing process can be simplified.

Figure 3B:
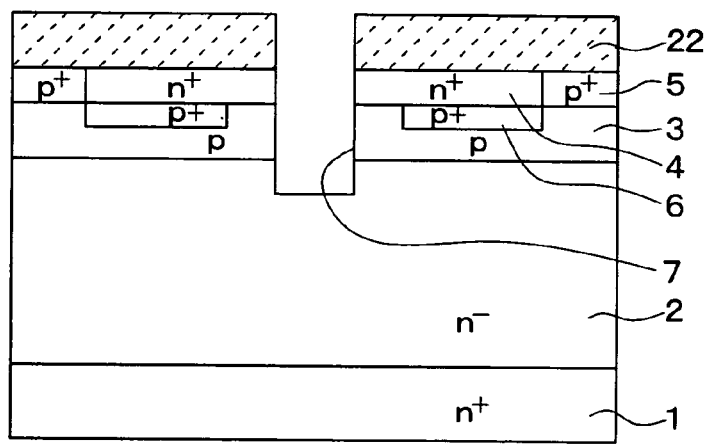

During a process illustrated in FIG. 3B, an etching mask 22, for example, made of LTO is formed on the P type base region 3, the N+ type source region 4, the P+ type contact region 5, and the exposed portion of the N– type drift layer 2. The etching mask 22 is treated by a photolithography process so that opening portions are provided at regions where the trench 7 is provided. Then, an anisotropic etching process is performed using the etching mask 22. After that, an isotropic etching process and/or a sacrificial oxidation is performed if needed. Thereby, the trench 7 is provided. After that, the etching mask 22 is removed.

Figure 3C:
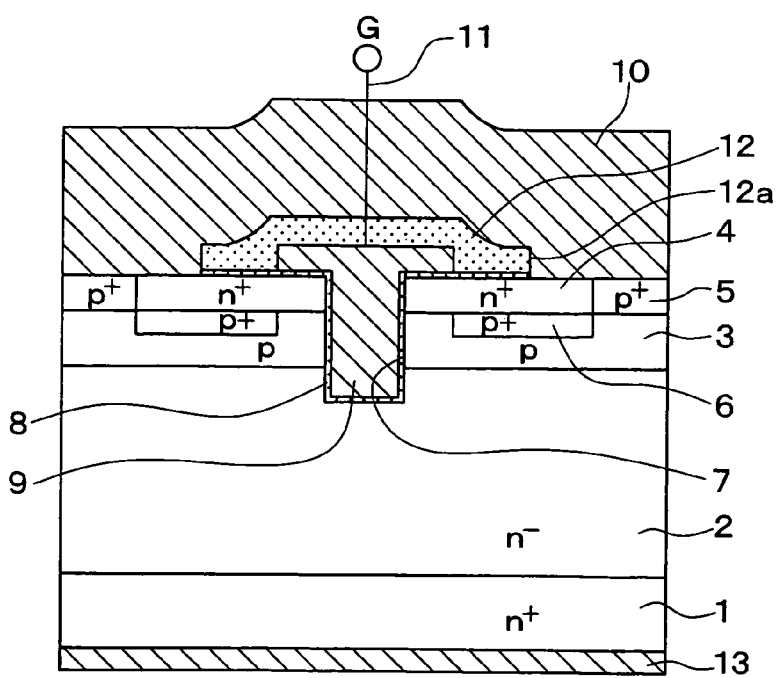

During a process illustrated in FIG. 3C, the gate oxide layer 8 is formed. For example, the gate oxide layer 8 is formed by thermal oxidation of a pyrogenic method in a wet atmosphere, for example. The trench 7 has the bottom surface of (000-1)-face and has the side surface extending in [11-20] direction. For example, the side surface is (1120)-face. When the gate oxide layer 8 is formed by thermal oxidation, the oxidizing rate at the bottom portion of the trench 7 is five times faster than the side surface of the trench 7. Thus, the gate oxide layer 8 has the thickness of about 40 nm on the side surface of the trench 7 and has the thickness of about 200 nm at the bottom portion of the trench 7.

A polysilicon layer doped with the N type impurity is formed on the surface of the gate oxide layer 8, for example, at about 600 degrees centigrade so as to have a thickness about 440 nm. Then, the polysilicon layer and the gate oxide layer 8 is patterned with a mask made of a resist that is formed by a photolithography etching. Thereby, the gate oxide layer 8 and the gate electrode 9 remain in the trench 7.

A process after forming the gate oxide layer 8 and the gate electrode 9 is similar to a known process. Therefore, the process after forming the gate oxide layer 8 and the gate electrode 9 is not illustrated. The interlayer insulating layer 12 is formed and the contact holes 12a extending to the N+ type source region 4 and the P+ type contact region 5 are provided in a cross section of the interlayer insulating layer 12. In addition, the contact hole extending to the gate electrode 9 is provided in another cross section of the interlayer insulating layer 12. A layer of an electrode material is formed on the interlayer insulating layer 12 so as to fill the contact holes. The layer of the electrode material is pattern-formed so that the source electrode 10 and a gate wiring 11 are formed. Furthermore, the drain electrode 13 is formed on the rear surface of the N+ type substrate 1. Thereby, the MOSFET illustrated in FIG. 1 is formed.

Second Embodiment

Figure 4:
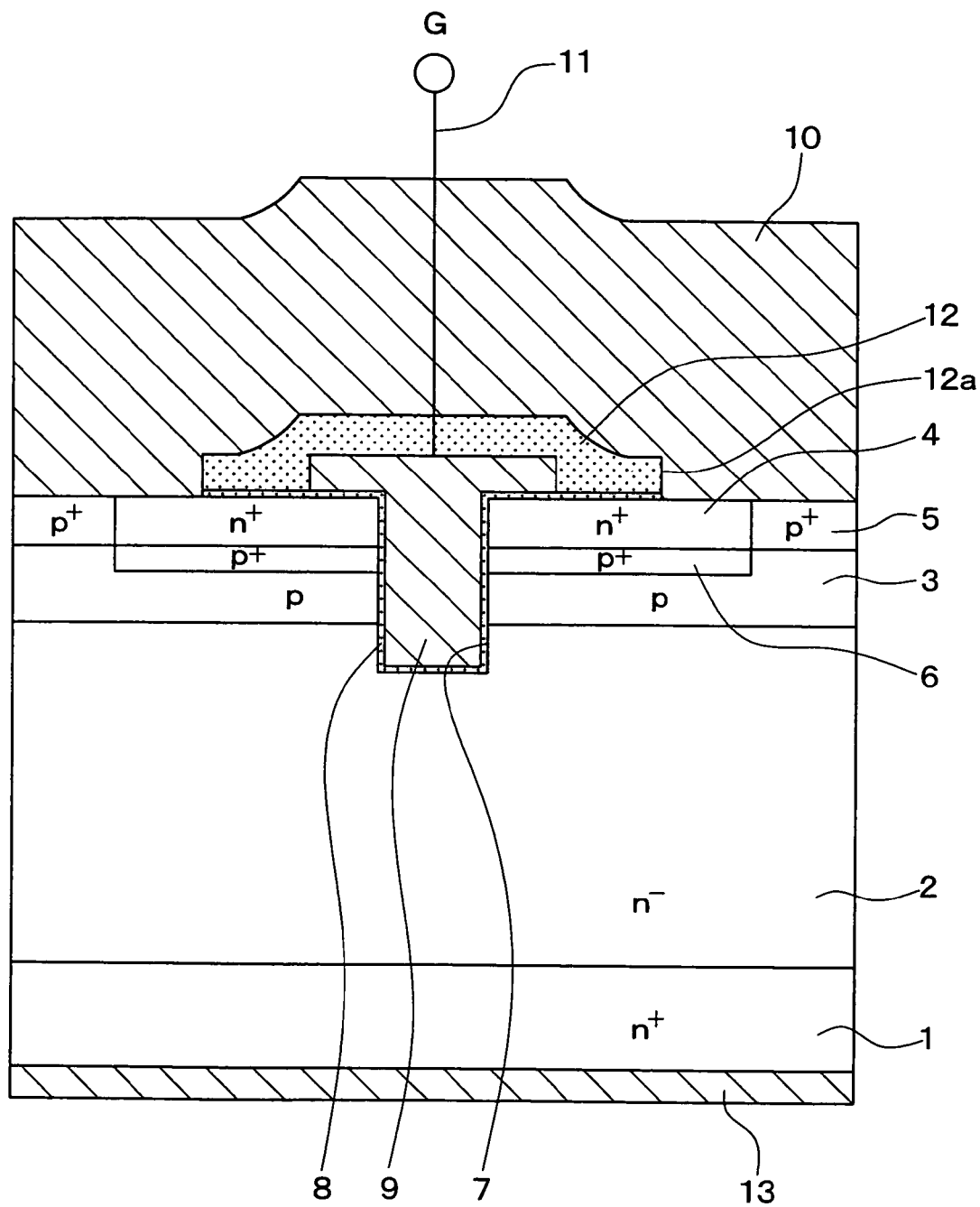
FIG. 4 is a diagram illustrating a cross-sectional view of a MOSFET in an SiC semiconductor device according to a second embodiment of the present invention.

A MOSFET in an SiC semiconductor device according to a second embodiment of the present invention will be described with reference to FIG. 4. Since a basic structure of the MOSFET according to the present embodiment is similar to the first embodiment, a different portion will be mainly described.

The MOSFET has an inversion type trench gate structure. The P+ type layer 6 is disposed under the N+ type source region 4 and is in contact with the gate oxide layer 8 on the side surface of the trench 7. In this way, the P+ type layer 6 may be in contact with the gate oxide layer 8. When the P+ type layer 6 is in contact with the gate oxide layer 8, the P+ type layer 6 may affect the channel region. Thus, the channel mobility may be reduced compared with the first embodiment.

A manufacturing method of the MOSFET according to the present embodiment is similar to the first embodiment. The P+ type layer 6 is in contact with the gate oxide layer 8 and has similar shape to the N+ type source region 4. Thus, during the process illustrated in FIG. 2C, the mask 21 is pattern-formed so that opening portions are provided at the regions where the N+ type source region 4 and the P+ type layer 6 will be formed, and during the process illustrated in FIG. 3A, the additional photolithography process can be omitted. Therefore, the manufacturing process of the MOSFET can be simplified.

In addition, the MOSFET according to the present embodiment can secure a high drain-source breakdown voltage regardless of the depth of the N+ type source region 4.

Third Embodiment

Figure 5:
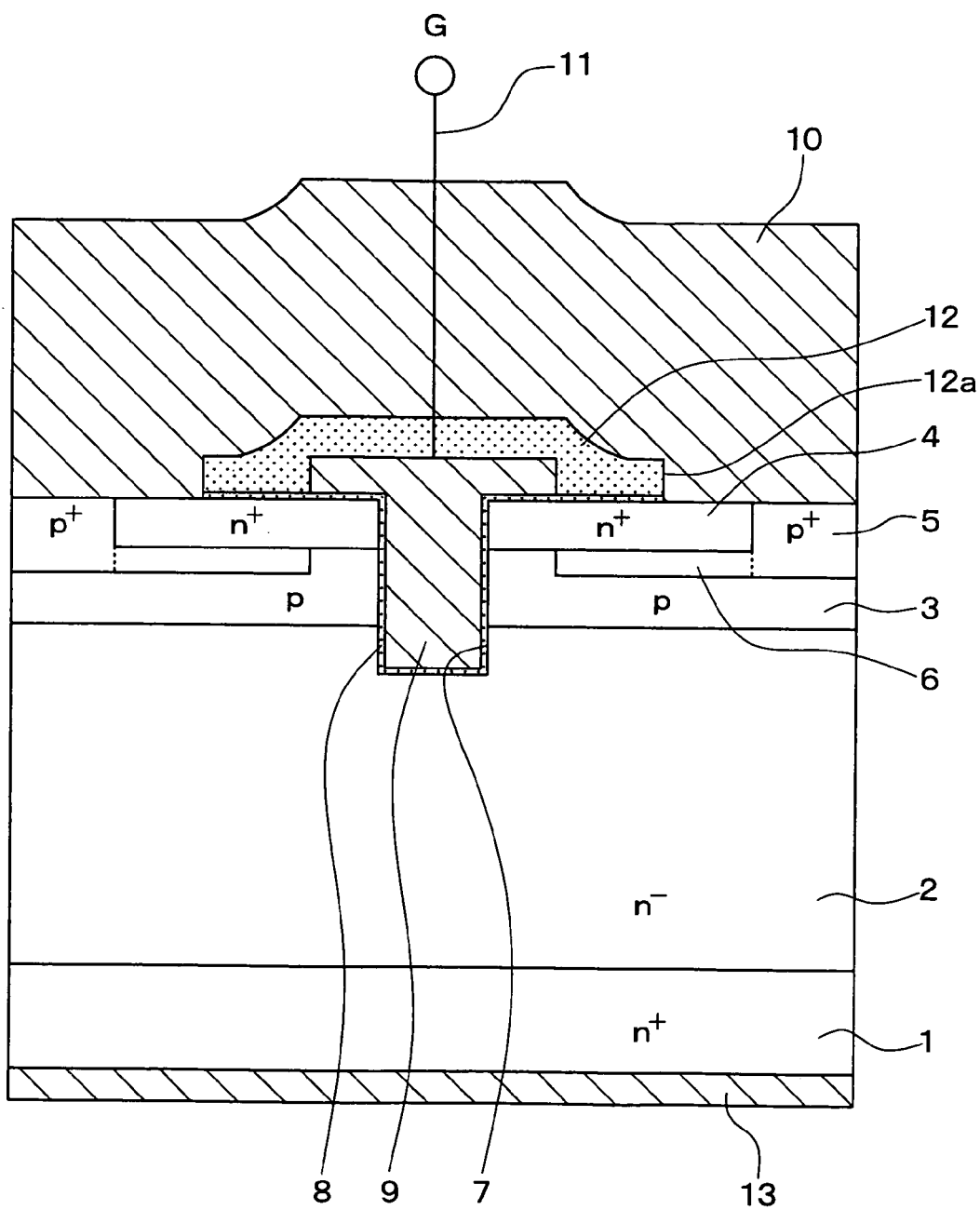
FIG. 5 is a diagram illustrating a cross-sectional view of a MOSFET in an SiC semiconductor device according to a third embodiment of the present invention.

A MOSFET in an SiC semiconductor device according to a third embodiment of the present invention will be described with reference to FIG. 5. Since a basic structure of the MOSFET according to the present embodiment is similar to the first embodiment, a different portion will be mainly described.

The MOSFET has an inversion type trench gate structure. A bottom of the P+ type contact region 5 is located at substantially the same depth as a bottom of the P+ type layer 6.

A manufacturing method of the MOSFET according to the present embodiment is similar to the first embodiment. Since the bottom of the P+ type contact region 5 is located at substantially the same depth as the bottom of the P+ type layer 6, the P+ type contact region 5 and the P+ type layer 6 can be formed at the same time. Thus, the process illustrated in FIG. 2B and the process illustrated in FIG. 2C can be performed at the same time.

If the process illustrated in FIG. 2B and the process illustrated in FIG. 2C are performed at the same time, opening portions are provided at regions of the mask 20 where the P+ type contact region 5 and the P+ type layer 6 will be formed. Then, the P type impurities are ion-implanted through the mask 20. In such a case, the N+ type source region 4 and the P+ type layer 6 are formed by using different masks.

Also in the present embodiment, the MOSFET can secure a high drain-source breakdown voltage regardless of the depth of the N+ type source region 4.

Fourth Embodiment

Figure 6:
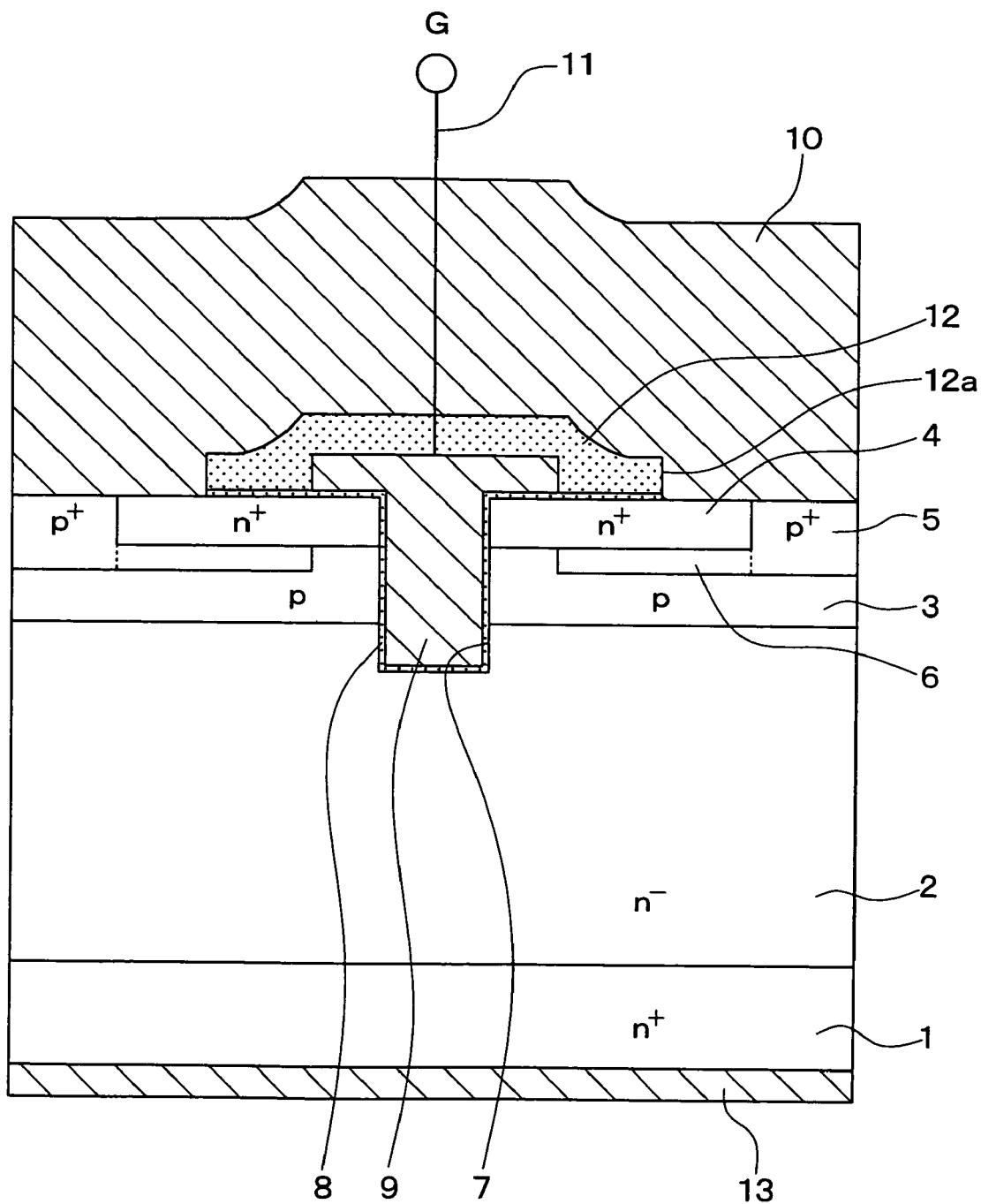
FIG. 6 is a diagram illustrating a cross-sectional view of a MOSFET in an SiC semiconductor device according to a fourth embodiment of the present invention.
Figure 7:
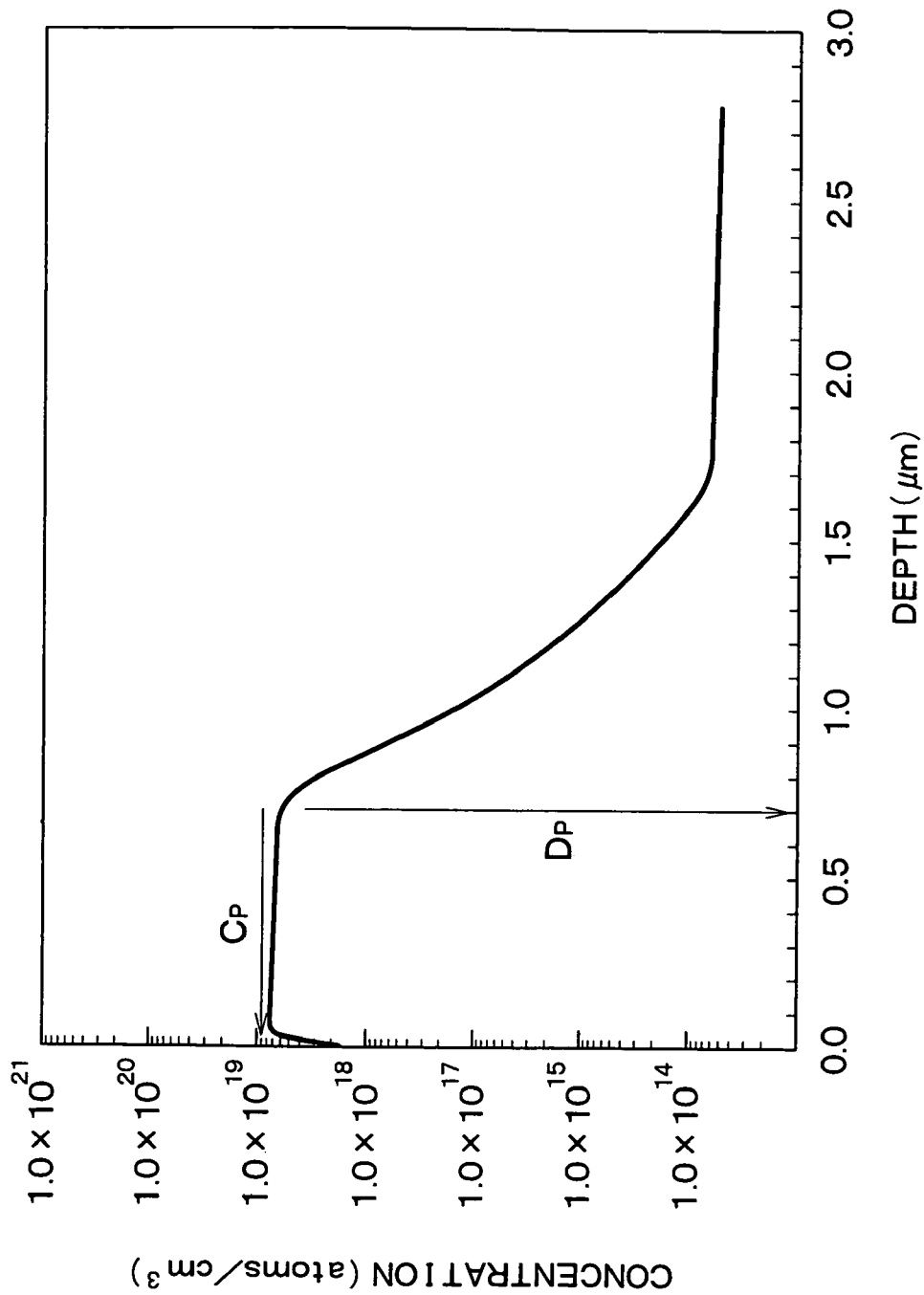
FIG. 7 is a graph illustrating a concentration distribution of N type impurities according to the related art.

A MOSFET in an SiC semiconductor device according to a fourth embodiment of the present invention will be described with reference to FIG. 6. The MOSFET according to the present embodiment is a combination of the MOSFET according to the second embodiment and the MOSFET according to the third embodiment. Since a basic structure of the MOSFET according to the present embodiment is similar to the first embodiment, a different portion will be mainly described.

The MOSFET has an inversion type trench gate structure. The P+ type layer 6 is in contact with the gate oxide layer 8 on the side surface of the trench 7. In addition, the bottom of the P+ type contact region 5 is located at substantially the same depth as the bottom of the P+ type layer 6. Also in the present embodiment, the MOSFET can secure a high drain-source breakdown voltage regardless of the depth of the N+ type source region 4.

A manufacturing method of the MOSFET according to the present embodiment is similar to the first embodiment. Since the bottom of the P+ type contact region 5 is located at substantially the same depth as the bottom of the P+ type layer 6, and the P+ type layer 6 is in contact with the gate oxide layer 8, the P+ type contact region 5 and the P+ type layer 6 can be epitaxially formed. Thereby, the manufacturing process of the MOSFET can be simplified.

Other Embodiments

Although the present invention has been fully described in connection with the exemplary embodiments thereof with reference to the accompanying drawings, it is to be noted that various changes and modifications will become apparent to those skilled in the art.

The SiC semiconductor devices according to the first to fourth embodiments respectively include the N channel type MOSFET, as an example. Alternatively, the SiC semiconductor devices may respectively include a P channel type MOSFET in which conductivity types of the components are reversed. Alternatively, the SiC semiconductor devices may respectively include insulated gate bipolar transistors (IGBTs) each having a trench gate structure. In a case where the SiC semiconductor devices according to the first to fourth embodiments respectively include the IGBTs, the conductivity type of the N+ type substrate 1 is changed from the N conductivity type to the P conductivity type.

The above-described impurity concentrations and thicknesses are example and may be changed optionally. In the SiC semiconductor devices according to the first to fourth embodiments, the N+ type substrate 1 has the front surface of (000-1)-face, and the side surface of the trench 7 extends in [11-20] direction, as an example. A substrate having another plan direction can also be used.

When an orientation of a crystal face is described, it is originally required for attaching a bar above a desired figure. However, the bar is attached before the figure in the present application.

What is claimed is:

1. A silicon carbide semiconductor device comprising:
   a substrate made of silicon carbide and having one of a first conductivity type and a second conductivity type, the substrate having first and second opposing surfaces;

a drift layer disposed on the first surface of the substrate, the drift layer made of silicon carbide and having the first conductivity type;

a base region disposed on the drift layer and having the second conductivity type;

a source region disposed above the base region and having the first conductivity type;

a trench penetrating the source region and the base region to the drift layer;

a gate insulating layer disposed on a surface of the trench;

a gate electrode disposed on a surface of the gate insulating layer in the trench;

an interlayer insulating layer disposed above the gate electrode and the source region, the interlayer insulating layer having a contact hole;

a first electrode disposed on the interlayer insulating layer, the first electrode electrically coupled with the source region and the base region through the contact hole;

a second electrode disposed on the second surface of the substrate; and a second conductivity-type layer disposed at a portion of the base region located under the source region, the second conductivity-type layer having the second conductivity type and having an impurity concentration higher than the base region, the second conductivity-type layer extending from an inside of the contact hole to an outside of the contact hole toward the trench in a direction parallel to the first surface of the substrate, wherein an inversion channel is provided at a surface portion of the base region located on a side surface of the trench and electric current flows between the first electrode and the second electrode through the source region and the drift layer by controlling a voltage applied to the gate electrode.

2. The silicon carbide semiconductor device according to claim 1, wherein:

the second conductivity-type layer is disposed at a predetermined distance from the gate insulating layer located on the side surface of the trench.

3. The silicon carbide semiconductor device according to claim 2, wherein the predetermined distance is greater than or equal to about 0.3 µm.

4. The silicon carbide semiconductor device according to claim 1, wherein the second conductivity-type layer extends underneath the contact hole along substantially an entire area thereof.

5. A silicon carbide semiconductor device comprising:

a substrate made of silicon carbide and having one of a first conductivity type and a second conductivity type, the substrate having first and second opposing surfaces;

a drift layer disposed on the first surface of the substrate, the drift layer made of silicon carbide and having the first conductivity type;

a base region disposed on the drift layer and having the second conductivity type;

a source region disposed above the base region and having the first conductivity type;

a trench penetrating the source region and the base region to the drift layer;

a gate insulating layer disposed on a surface of the trench;

a gate electrode disposed on a surface of the gate insulating layer in the trench;

a first electrode electrically coupled with the source region and the base region;

a second electrode disposed on the second surface of the substrate; and a second conductivity-type layer disposed at a portion of the base region located under the source region, the second conductivity-type layer having the second conductivity type and having an impurity concentration higher than the base region, wherein an inversion channel is provided at a surface portion of the base region located on a side surface of the trench and electric current flows between the first electrode and the second electrode through the source region and the drift layer by controlling a voltage applied to the gate electrode; and a contact region disposed on an opposite side of the source region from the trench, the contact region electrically coupling the base region and the first electrode, the contact region having the second conductivity type and having an impurity concentration higher than the base region and substantially the same as the second conductivity-type layer, the contact region having a bottom located at substantially the same depth as a bottom of the second conductivity-type layer.

* * * * *